United States Patent [19]

Hogan et al.

[11] 3,746,932

[45] July 17, 1973

[54] PANEL BOARD SYSTEMS AND COMPONENTS THEREFOR

[75] Inventors: Warren R. Hogan; Reidar G. Larsen, both of Attleboro, Mass.

[73] Assignee: Texas Instruments Incorporated, Dallas, Tex.

[22] Filed: Dec. 28, 1970

[21] Appl. No.: 101,564

[52] U.S. Cl... 317/101 DH, 174/52 S, 317/101 CM, 339/176 MP

[51] Int. Cl. .............................................. H02b 1/02

[58] Field of Search ............... 317/101 CC, 101 CP, 317/101 DH, 100, 101 LM; 174/52.5 FP; 339/176 MP, 14 R, 17 LM, 17 LC

[56] References Cited

UNITED STATES PATENTS

| | | | |
|---|---|---|---|
| 3,401,369 | 9/1968 | Palmateer et al. | 339/17 LC |
| 3,587,029 | 6/1971 | Knowles | 339/176 MP |
| 3,300,686 | 1/1967 | Johnson et al. | 317/101 CM |
| 3,482,201 | 12/1969 | Schneck | 339/176 MP |
| 3,484,534 | 12/1969 | Kilby et al. | 317/101 CP |
| 3,518,610 | 6/1970 | Goodman et al. | 339/176 MP |
| 3,149,893 | 9/1964 | Dupre | 339/176 MP |
| 3,268,772 | 8/1966 | Kamei et al. | 317/100 |
| 3,334,325 | 8/1967 | Conrad et al. | 339/14 R |
| 3,147,404 | 9/1964 | Sinner | 317/101 DH |
| 3,081,416 | 3/1963 | Tuttle et al. | 317/101 CM |
| 3,495,023 | 2/1970 | Hessinger et al. | 174/52.5 |
| 3,404,215 | 10/1968 | Burks et al. | 174/52.5 |

*Primary Examiner*—David Smith, Jr.
*Attorney*—Harold Levine, Edward J. Connors, Jr., John A. Haug, James P. McAndrews and Gerald B. Epstein

[57] ABSTRACT

A panel board system particularly adapted for mounting high speed integrated circuit devices is shown to include integrated circuit packages, connectors and panel board means which each incorporate impedance matching means to provide for complete integrity of the system. The integrated circuit packages have an integrated circuit chip mounted on one side of a ceramic card and have the chip electrically connected to a plurality of printed circuit paths formed on the same side of the card. These circuit paths terminate in closely spaced relation to each other along one edge of the card and a metal ground plane is formed on the opposite side of the card to provide controlled impedance in the integrated circuit package. Each connector receives an edge of an integrated circuit package and has a plurality of contact means located in closely spaced relation to each other along one side of a dielectric member within the connector for detachably engaging respective circuit path terminations on the integrated circuit package. A metal ground plane formed on the opposite side of this dielectric member provides matching impedance within the connector. Preferably the connector has additional contact means mounted on the ground plane within the connector for detachably engaging the ground plane on the integrated circuit package. Terminal portions of the connector contact means extend from the connector into the panel board, preferably in staggered relation to each other, to be electrically connected to impedance matched circuit path and ground plane means on the panel board, the staggered relationship of the contact terminal portions facilitating electrical connection of the terminal portions to the circuit path and ground plane means of the panel board when connectors are mounted with high density on the panel board.

When high speed integrated circuit elements such as emitter-coupled logic (ECL) devices and the like are mounted on a conventional panel board system, the performance of the system is limited by the performance of the means employed in the conventional system for electrically connecting the integrated circuits to circuit elements on the panel board. These performance limitations primarily result from the circuit arrangements provided within conventional integrated circuit packages themselves and from the means conventionally employed in making electrical connections between the integrated circuit packages and connectors mounted on the panel board.

13 Claims, 10 Drawing Figures

INVENTOR.

BY Reidar G. Larsen
Warren R. Hogan
James P. McAndrews
Att'y.

INVENTOR.

BY Reidar G. Larsen
Warren R. Hogan
James P. McAndrews
Att'y.

INVENTOR.

BY Reidar G. Larsen
Warren R. Hogan
James P. McAndrews
Att'y.

INVENTOR.

BY Reidar G. Larsen
Warren R. Hogan
James P. McAndrews
Att'y.

INVENTOR.

BY Reidar G. Larsen
Warren R. Hogan
James P. McAndrews
Att'y.

PANEL BOARD SYSTEMS AND COMPONENTS THEREFOR

It is an object of this invention to provide a novel and improved panel board system; to provide such a system which is particularly adapted for mounting high speed integrated circuit devices; to provide novel and improved integrated circuit packages; to provide such packages which achieve controlled impedances within the packages; to provide novel and improved connectors for mounting said integrated circuit packages on a panel board; to provide such connectors which achieve impedance matching; to provide such connectors which are easily connected to circuit path means on a panel board; and to provide such packages, connectors and systems which are of economical construction.

Briefly described, the novel and improved system of this invention includes a panel board which embodies a layer of dielectric material having conventional circuit path means and ground plane means formed on opposite sides of the dielectric layer. The novel and improved integrated circuit package of this invention then mounts an integrated circuit chip on one side of a ceramic card and electrically connects chip terminals to a plurality of printed circuit paths formed on the same side of the ceramic card. The printed circuit paths extend from the integrated circuit chip and terminate in closely spaced relation to each other along one edge of the card, a metal ground plane being formed on the opposite side of the ceramic card to provide controlled impedance in the integrated circuit package. The edge of this integrated circuit package is then inserted into the novel and improved edge-type connector provided by this invention, this connector having a plurality of contact means located in closely spaced relation to each other along one side of a dielectric spacer member within the connector for detachably engaging respective circuit path terminations on the integrated circuit package. A metal ground plane is formed on the opposite side of the dielectric spacer within the connector to provide matching impedances in the connector. Preferably, additional connector contact means are attached to the connector ground plane to detachably engage the ground plane of the integrated circuit package. The connector scope means preferably have terminal portions which extend from the connectors in rows in staggered relation to each other to extend into mating apertures in the panel board which are also arranged in rows in staggered relation to other, thereby to provide increased spacing between the connector terminal portions for facilitating electrical connection of the terminal portions to impedance matched circuit path and ground plane means on the panel board.

In this way, impedance matching is achieved in the panel board system from the integrated circuit chip through the panel board for providing substantially complete integrity of the system and for significantly enhancing the performance of the system, particularly where high speed integrated circuits are utilized. The system is exceedingly compact and is capable of incorporating relatively large scale integrated circuits with relatively high density within the system while permitting electrical connections to be conveniently made between the connectors and panel board of the system. The integrated circuit packages, the connectors and the panel board itself are also characterized by their relatively inexpensive constructions.

Other objects, advantages and details of this invention appear in the following detailed description of preferred embodiments of the invention, the detailed description referring to the drawing in which.

Figure 1:
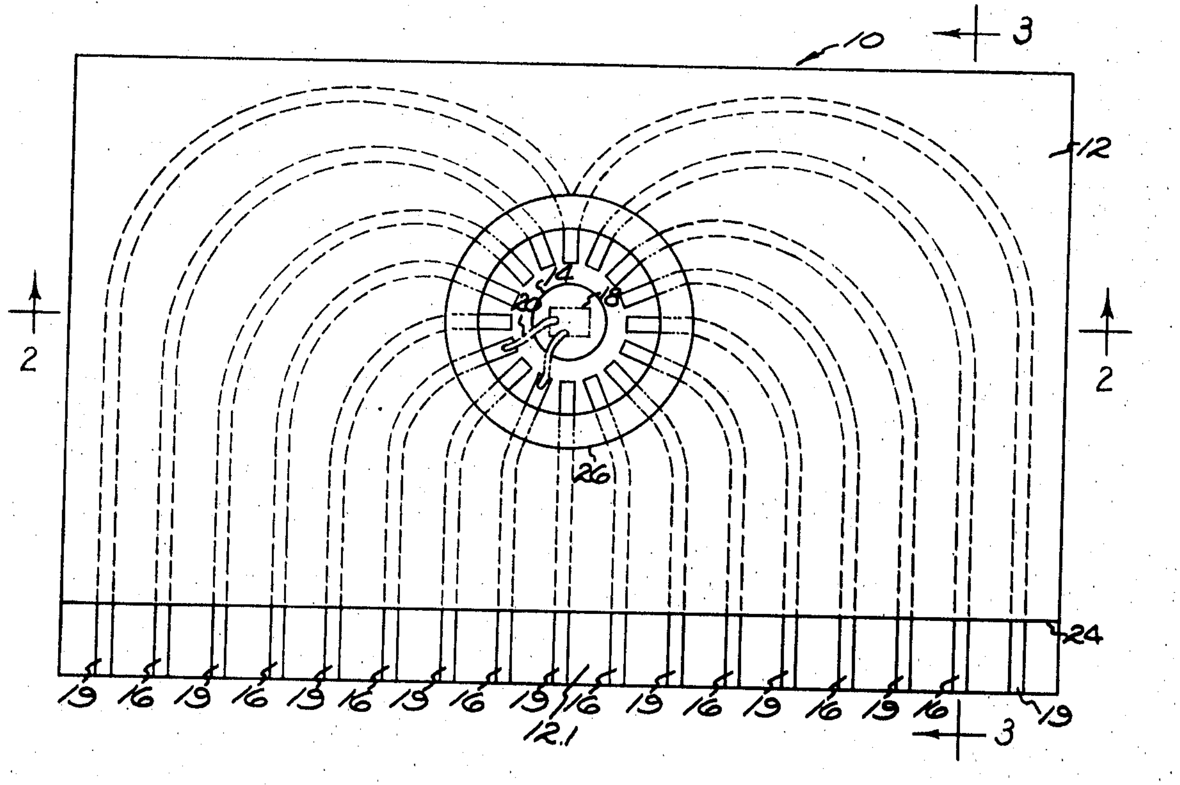
FIG. 1 is a plan view of the integrated circuit package provided by this invention.
Figure 2:
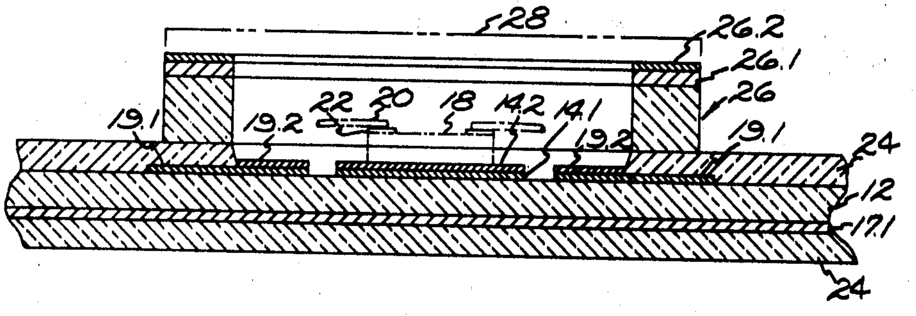
FIG. 2 is a section view, to enlarged scale, along line 2—2 of FIG. 1.
Figure 3:
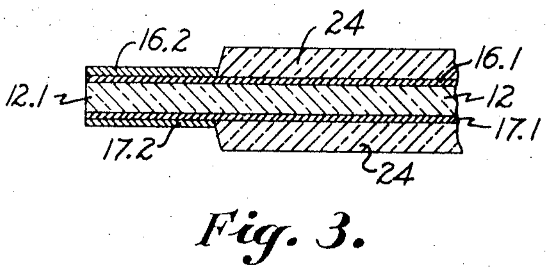
FIG. 3 is a partial section view along line 3—3 of FIG. 1.

Referring to the drawings, 10 in FIGS. 1–4 indicates the novel and improved integrated circuit package of this invention which is shown to include a thin, rigid card 12 of ceramic or other dielectric material having a metal pad 14 formed on one face of the card and having a plurality of electrically conductive, metallic, printed circuit paths 16 formed on the same face of the card, the circuit paths extending from locations spaced around the pad 14 to terminate in closely spaced relation to each other along one edge 12.1 of the card. A chip 18 of semiconducting material having an integrated circuit (preferably a high speed circuit such as an emitter-coupled logic circuit displaying medium scale or larger circuit integration) formed thereon is mounted on the pad 14 in any conventional manner and lead wires, indicated by the broken lines 20 in FIGS. 1 and 2, are electrically connected between the respective circuit paths 16 and the integrated circuit terminals 22 on the chip 18. In accordance with this invention, a metal ground plane 17 is formed on the opposite side of the ceramic card, whereby the circuit paths 16 are provided with controlled impedances within the integrated circuit package 10. If desired, additional metallized shielding paths 19 are formed on the ceramic card 12 between the circuit paths 16 for assuring electrical isolation of the circuit paths 16 from each other.

The device 10 as above described is formed in any conventional manner according to this invention. For example, in a preferred embodiment of the invention, aluminum oxide or beryllium oxide powder is mixed with an epoxy binder and is press-formed into a card shape. The press-formed card is then baked at high temperature to form a coard 12 of aluminum oxide or beryllium oxide ceramic material, the card preferably having broad surfaces about 2.00 inches long and 1.00 inches wide and having a thickness of about 0.040 inches. One of the broad card surfaces is then masked to leave portions of the card surface exposed to define the desired configuration of the pad 14 and the circuit paths 16 (and, if desired, of the shielding paths 19) on the card surface. Electrically conductive tungsten metal or the like in liquid form is then wiped across the masked card surface and across the opposite card surface to coat the exposed portions of these card surfaces. The coated card is then baked or otherwise treated for removing the masking material and for adhering the metal coatings to the card to define the pad 14, the circuit paths 16, the metal plane 17 and, if included, the shielding paths 19, these tungsten coatings being indicated at 14.1, 16.1, 17.1 and 19.1 in FIGS. 2 and 3. A liquid glazing material 24 is then applied to the board card surfaces to cover substantial areas of the card surfaces while leaving the pad 14, the end portions of the circuit paths 16 and the shielding paths 19, and an edge portion of the metal plane 17 exposed. While the glazing material is still preferably in liquid form, a ceramic ring 26, preferably formed in the same manner as the card 12 and having a tungsten metal coating on one annular surface thereof as indicated at 26.1 in FIG. 2, is applied to the glazing material around the pad 14 and around the portions of the circuit paths 16 and shielding paths 19 which are exposed adjacent to the pad 14. The glazed card is then heated and cooled or otherwise treated for hardening the glazed dielectric coatings 24 to enclose substantial portions of the circuit paths 16, of the shielding paths 19 and of the metal plane 17 and to adhere the ceramic ring 26 to the glazed coating. The glazed card is then subjected to electroless plating or the like in conventional manner to deposit precious metal coatings or the like 14.2, 16.2, 19.2, 17.2 and 26.2 on the pad 14, on the end portions of the circuit paths 16 and shielding paths 19, on the edge of the ground plane 17 and on the ceramic ring 26. As will be understood, no precious metal is deposited on the ceramic material of the card 12 or on the glazed coatings 24 in a conventional electroless plating process.

In this arrangement, the integrated circuit chip 18, preferably formed of semiconducting material such as silicon, is readily bonded to the pad 14 by thermal compression bonding or the like. Similarly, lead wires 20 are connected to the plated ends of the circuit paths 16 adjacent to the pad 14 and to the terminals 22 on the integrated circuit chip 18 by thermal compression bonding or the like for electrically interconnecting the chip terminals and the circuit paths. After connecting of the lead wires 20 in this manner, a cover member such as a metal plate or the like indicated by the broken lines 28 in FIG. 2, is bonded to the plating 26.2 on the ceramic ring 26 for enclosing and sealing-in the integrated circuit chip 18 as will be understood.

While a particular construction of the integrated circuit device 10 is described in detail by way of illustrating this invention, it should be understood that this invention includes all modifications and equivalents of the described device in which an integrated circuit chip is mounted on a ceramic or dielectric card and in which terminals of the integrated circuit device are electrically connected to electrically conductive circuit paths formed on the card to terminate in spaced relation to each other along the edge of the card, the card having a metal ground plane formed on the opposite side thereof to provide controlled impedances within the integrated circuit device 10. It should also be understood that although the device 10 as illustrated is shown to have eight circuit paths 16 terminating along one edge of the device and to have shielding paths 19 located between the circuit paths, the number of circuit paths shown in the drawings has been limited for clarity of illustration. In the preferred embodiment of this invention, the device 10 incorporates a chip 18 which provides medium scale circuit integration, the card having on the order of forty circuit paths 16 formed thereon electrically connected to respective terminals 22 on the integrated circuit chip. For example, in a practical embodiment of this invention wherein the broad surface of the card 12 is 2.00 inches long and 1.00 inches wide, the forty circuit paths 16 are preferably arranged to terminate along the card edge 12.1 with 0.050 inch center-to-center spacings between the path terminations.

Figure 5:
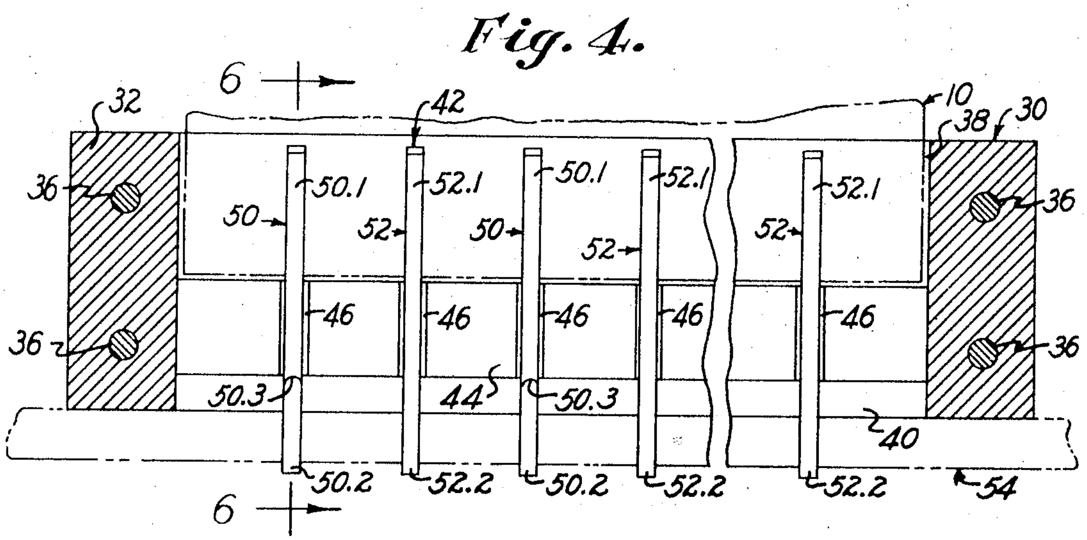
FIG. 5 is a section view along the longitudinal axis of the connector of this invnetion.
Figure 6:
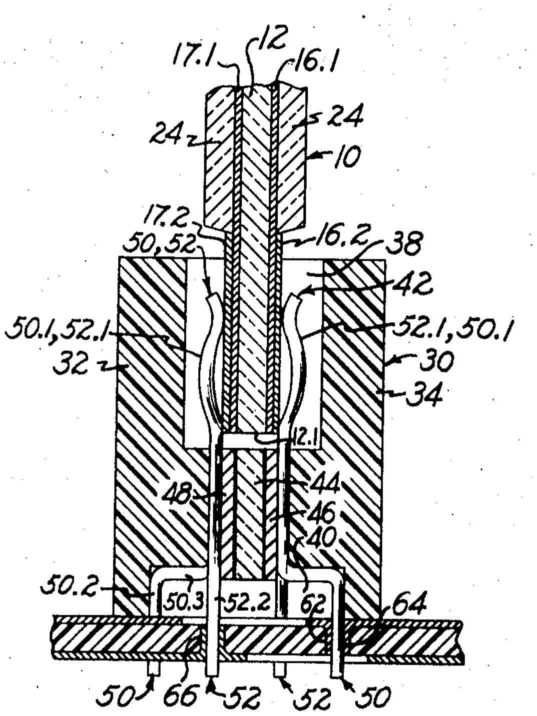
FIG. 6 is a section view along line 6—6 of FIG. 5.
Figure 7:
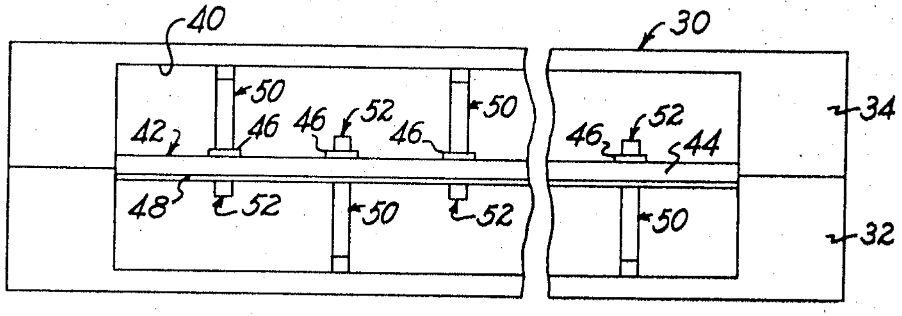
FIG. 7 is a bottom view of the connector of this invention.

In accordance with this invention, the novel panel board system further incorporates novel connectors 30 as shown in FIGS. 5–7, each of the connectors embodying two connector halves 32 and 34 of a dielectric material such as glass-filled nylon, the connector halves being held together by pins 36 or being bonded or otherwise secured together in any conventional manner to define a recess 38 along one side of the connector, to define recess 40 along the opposite side of the connector, and to capture a contact assembly 42 between the connector halves. As shown, the contact assembly 42 includes a relatively long but narrow and thin dielectric member or spacer 44 which is preferably formed of the same material as the ceramic card 12. Preferably the spacer 44 also has substantially the same thickness as the ceramic card 12. This spacer is provided with a plurality of metallized areas 46 which are disposed in spaced relation to each other along one side of the spacer 44 as shown in FIG. 5, each of the metallized areas 46 extending from one edge to the opposite edge of the spacer. The metallized areas 46 preferably have substantially the same width as the circuit paths 16 formed on the ceramic card 12 and have the same spacings between the metallized areas 46 as are provided between the terminations of the circuit paths 16 along the ceramic card edge 12.1. The spacer 44 is also provided with a metallized ground plane 48 on the side of the spacer opposite the metallized areas 46 as shown in FIG. 6, this metal ground plane covering substantially all of this opposite side of the spacer 44.

In this arrangement, contact means 50 and 52 are incorporated in the contact assembly 42, each of these contact means having a leaf portion 50.1, 52.1 and a terminal portion 50.2, 52.2, the contact 50 differing from the contact 52 in having an additional portion 50.3 offsetting the contact terminal portion 50.2 from the contact leaf portion 50.1. These contact means 50 and 52 are preferably soldered or otherwise secured to the metallized areas 46 and 48 of the spacer 44 as shown in the drawings with contact means 50 and 52 being secured to alternate metallized areas 46 along one side of the spacer 44 and being secured with opposite alternation to the metal ground plane 48 on the other side of the connector spacer 44. In this arrangement, as shown in FIGS. 6 and 7, the terminal portions of the connector contact means extend from the connector in rows in staggered relation to each other in said rows. In this way, while the leaf portions of the connector contact means are located in closely spaced relation to each other, the terminal portions of the connector contacts have relatively greater spacings therebetween for facilitating making of electrical connections to these terminal portions. The connector contact means are preferably formed of beryllium copper or phosphor bronze or the like to provide the contact means with suitable spring characteristics as will be understood.

In accordance with this invention, the panel board system further incorporates a somewhat conventional panel board 54 which embodies a layer 56 of dielectric material such as fiberglass-filled epoxy or the like and which has electrically conductive metal layers of copper or the like formed on opposite sides of the dielectric layer to form conventional circuit path or power plane means 58 and ground plane means 60 on the panel board. As will be understood, the panel board has a plurality of apertures 62 therein arranged in a plurality of rows with a staggered relationship between the apertures in adjacent rows so that the panel board apertures are adapted to receive the staggered terminal portions of the contact means of the connectors 30 within the panel board apertures. As indicated in FIG. 6, the circuit path means 58 and the ground plane means 60 of the panel board 54 are normally spaced from the panel board apertures in conventional manner but the apertures are adapted to be plated through as indicated at 64 and 66 in FIG. 6 to electrically connect the circuit path and ground plane means of the panel board to selected connector contact terminal portions extending through the panel board apertures.

Figure 4:
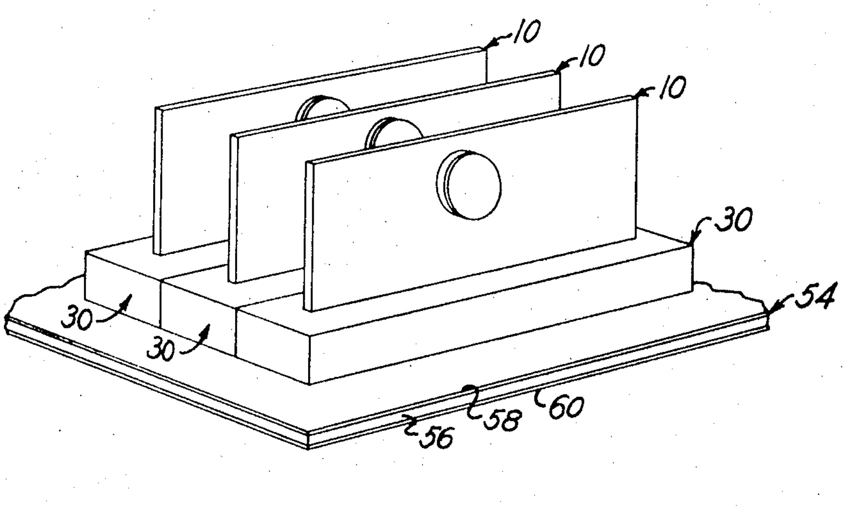
FIG. 4 is a perspective view, to reduced scale, of the panel board system of this invention.

In this arrangement, the integrated circuit packages 10, the connectors 30 and the panel board 54 are adapted to be assembled together as illustrated in FIGS. 4 and 6 to provide a panel board system in which impedance matching is achieved within the system from the integrated circuit chip in each package through the panel board of the system. That is, each integrated circuit package 10 is adapted to have one edge thereof inserted into the recess 38 of one of the connectors 30 so that the connnector contact means 50 and 52 attached to the metallized areas 46 on the connector spacer 44 detachably engage respective terminations of the circuit paths 16 in the integrated circuit package 10 and so that the additional connector contact means 50 and 52 attached to the metal ground plane 48 on the connector spacer 44 detachably engage the metal ground plane 17 on the integrated circuit package 10. The terminal portions of the connector contact means are then inserted through mating apertures in the panel board 54 as shown in FIG. 6 so that selected terminal portions are fitted into panel board apertures which have been plated through as indicated at 64 and 66 in FIG. 6 for electrically connecting selected connector contact means to the circuit path means 58 and ground plane means 60 of the panel board 54 respectively, thereby to complete a desired circuit in the panel board system.

In this construction, where the connector spacer 44 is formed of the same material and has the same thickness as the card 12 of the integrated circuit package 10 and where the circuit paths 16 in the package have the same width as the metallized areas 46 on the connector spacer 44, impedance matching is achieved between the integrated circuit package and the connector to provide controlled impedances from the integrated circuit chip 18 through the connector. The panel board 54 is then similarly proportioned, taking into account the possibly different material and different dielectric constant of the layer of dielectric material 56 in the panel board, to provide further impedance matching in the panel board system, whereby the system provides controlled impedance from the integrated circuit chip 18 in the package 10 through the panel board 54. In this way, the panel board system of this invention achieves improved performance particularly where high speed integrated circuit devices such as emitter coupled logic (ECL) devices are incorporated in the panel system. Further, the edge-like mounting of the integrated circuit packages 10 in the connectors 30 permits the panel board system to mount a very large number of integrated circuit packages in a very small volume. In addition, where the staggered terminal portions of the connector contact means are arranged as described to fit into mating, staggered apertures in the panel board 54, this improved density of integrated circuit package mounting on the panel board is achieved while permitting sufficient space between the connector terminal portions to facilitate electrical connection of the connector terminal portions to the circuit path and ground plane means of the panel board.

Figure 8:
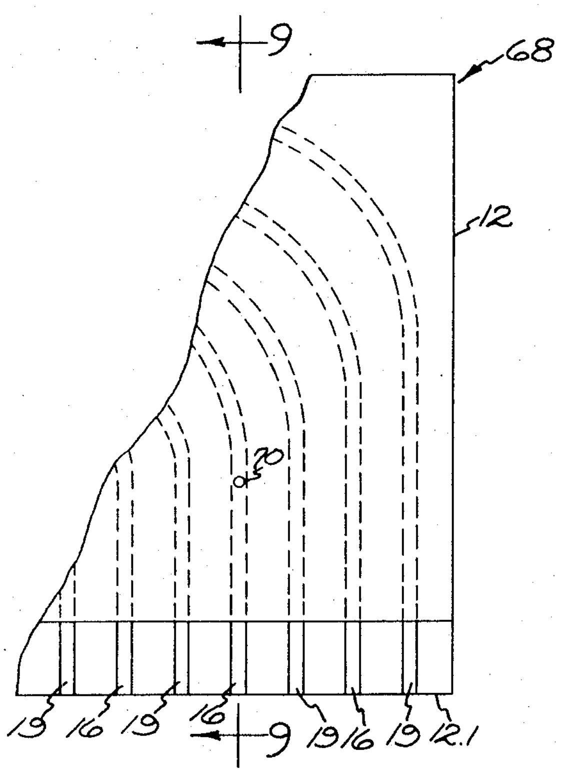
FIG. 8 is a partial plan view similar to FIG. 1 illustrating an alternate embodiment of the integrated circuit package of this invention.
Figure 9:
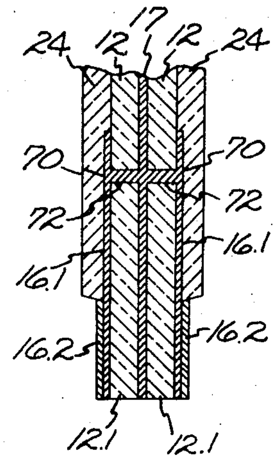
FIG. 9 is a partial section view, similar to FIG. 3, along line 9—9 of FIG. 8.
Figure 10:
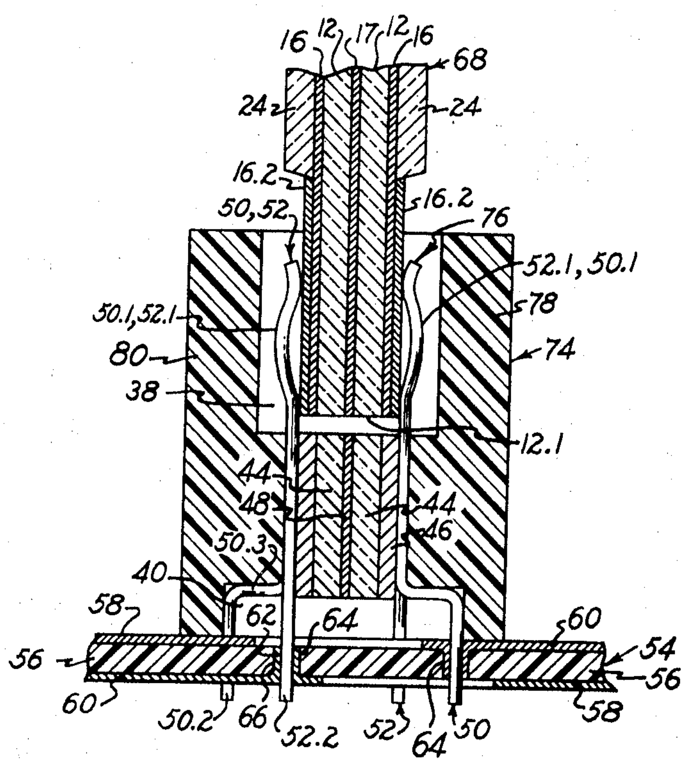
FIG. 10 is a section view similar to FIG. 6 illustrating an alternate embodiment of the connector of this invention.

In this regard, note that, where an alternate embodiment of the panel board system of this invention as illustrated in FIGS. 8–10 is utilized, even greater integrated circuit density is achieved in the panel board system. In this alternate embodiment of the panel board system, the system incorporates integrated circuit packages 68 which each essentially comprise a double package formed primarily of two of the integrated circuit packages 10 previously described. That is, as shown in FIGS. 8–10, the integrated circuit package 68 embodies two ceramic cards 12 which are bonded to respective opposite sides of a metal ground plane layer 17 sandwiched between the ceramic cards. The opposite, outwardly facing surfaces of these cards 12 are then each provided with a pad 14, with circuit paths 16, with a coating 24, with a ring 26, with an integrated circuit chip 18 mounted on the pad 14, and with lead wires 20 connecting terminals of the integrated circuit chip to the circuit paths 16, and with a cover 28 secured to the ring 26 as has been previously described with reference to the package 10. In this arrangement, the current paths 16 on each card 12 in the package 68 terminate along the respective edges 12.1 of the cards to be readily engaged by connector contact means. However, the metal ground plane 17 between the cards 12 is not adapted to be so conveniently engaged. Accordingly, holes 70 are preferably formed in the ceramic cards 12 and are filled with metal 72 such as tungsten to electrically connect the ground plane 17 to selected circuit paths 16.

In this alternate embodiment of the panel board system of this invention, the system then incorporates connectors 74 as are best illustrated in FIG. 10, each of the connectors 74 substantially corresponding to a connector 30 but having a modified contact assembly 76 as indicated in FIG. 10. That is, the connector 74 embodies connector halves 78 and 80 which form a recess 38 and a recess 40 and which capture the contact assembly 76 therebetween in a construction substantially corresponding to the structure of the connector 30. In the contact assembly 76, however, two relatively long but narrow and thin dielectric spacers 44 are bonded to respective opposite sides of a metal ground plane 48 sandwiched between the spacers, this metal ground plane 48 substantially covering one side of each of the spacers. Metallized areas 46 are then formed on each of the other sides of the respective spacers 44, these metallized areas being disposed in spaced relation to each other along these other spacer sides in an arrangement corresponding to the arrangement of these metallized areas in the connector 30. Connector contact means 50 and 52 are then secured to alternate metallized areas 46 in the contact assembly 76 so that the terminal portions of the connector contact means extend from the connector in rows and in staggered relationship to each other in adjacent rows as in the connector 30. In this embodiment of this invention, the connector contact means mounted on one of the connector spacers 44 detachably engage the terminations of the circuit paths 16 on one of the ceramic cards 12 in the integrated circuit package 68 whereas the connector contact means mounted on the other of the connector spacers detachably engage the terminations of the circuit paths 16 on the other of the ceramic cards 12 in the package 68. See FIG. 10. When the terminal portions 50.2 and 52.2 on the contact means of the connector 74 are then inserted into apertures in a panel board 54 as shown in FIG. 10, substantially all of the contact terminals are connected to the circuit path means 58 on the panel board as will be understood, only those contact means which detachably engage circuit paths 16 which have been electrically connected to the metal ground plane 17 in the integrated circuit package 68 being connected to the ground plane means 60 on the panel board 54. As will be understood, the panel board 54 in this alternate embodiment of the panel board system of this invention could comprise a five-layer panel board having a central ground plane sandwiched between two layers of dielectric material and having two circuit path layer means formed on the outer surfaces of the dielectric layers of the panel board within the scope of this invention. In this arrangement, of course, the contact means of the connectors 74 would be electrically connected to either of the outer circuit path layer means on the panel board.

In addition, it will be understood that, although only a single integrated circuit chip has been described as being mounted on each ceramic card 12 in the integrated circuit packages of this invention, several integrated circuit chips could be mounted on the same side of each ceramic card 12 to be connected to various circuit path means formed on that card side within the scope of this invention.

It should be understood that although particular embodiments of the integrated circuit packages, connectors and panel board systems of this invention have been described in detail by way of illustrating the invention, this invention includes all modifications and equivalents of the illustrated embdodiments which fall within the scope of the appended claims.

What is claimed is:

1. A panel board system comprising: at least one integrated circuit device embodying an integrated circuit chip having a plurality of chip terminals, dielectric means mounting said integrated circuit chip, a plurality of electrically-conductive members electrically connected at one end to selected chip terminals and extending in electrically-insulated relation to each other to terminate with selected center-to-center spacings therebetween along one edge of said dielectric means for forming circuit paths within said device, means enclosing said chip and substantial portions of said circuit path means while leaving said terminations of said circuit path means exposed at said edge of said dielectric means, and means within said device providing selected, controlled impedances in said device circuit paths; at least one connector detachably mounting said integrated circuit device, said connector embodying a plurality of electrical contact means providing corresponding circuit paths within said connector, said contact means each having a portion detachably engaging one of said circuit path terminations of said integrated circuit device and having a terminal portion extending from said connector, said connector having means within the connector providing impedances in said connector circuit paths matching said selected impedances in said device circuit paths; and a panel board having apertures receiving said terminal post portions of said connector contact means for mounting said connector on said board, said panel board having circuit path means electrically connected with terminal post portions of said connector contact means, said panel board having means providing said circuit path means of said panel board with impedances matching said impedances of said connector circuit paths.

2. A panel board system comprising: at least one integrated circuit device embodying a rigid, dielectric card, an integrated circuit chip mounted on one side of said card and having a plurality of chip terminals, a plurality of electrically conductive paths on said one card side in electrically insulated relation to each other, said circuit paths being electrically connected to selected chip terminals and terminating with selected center-to-center spacings between said paths along one edge of said card, means enclosing said chip and substantial portions of said circuit paths while leaving said terminations of said circuit paths exposed along said one edge of said card, and an electrically-conductive metal layer connectable to electrical ground on the opposite side of said card providing said device circuit paths with selected, controlled impedances; at least one connector embodying dielectric spacer means having a plurality of electrical contact means arranged on one side of said spacer means in spaced, electrically-insulated relation to each other with said selected center-to-center spacings between said contact means to provide corresponding circuit paths within said connector and having an electrically conductive metal layer connectable to electrical ground on the opposite side of said spacer means providing impedances in said connector circuit paths matching said impedances in said device circuit paths, said connector detachably mounting said integrated circuit device thereon and having said contact means in said connector engaging respective circuit path terminations of said integrated circuit device, said connector contact means having respective terminal post portions extending from said connector; and a rigid panel board having apertures receiving said terminal post portions of said connector contact means therein, said panel board embodying a layer of dielectric material having electrically conductive circuit path means on one side of said dielectric layer electrically connected to selected terminal post portions of said connector contact means and having an electrically conductive metal layer connectable to electrical ground on the opposite side of said dielectric layer providing impedances in said panel board circuit paths matching said impedances in said connector circuit paths.

3. A panel board system as set forth in claim 2 wherein said connector has additional contact means engaged with said metal layer on said opposite side of said connector spacer means, said additional contact means detachably engaging said metal layer on said opposite side of said integrated circuit device card, said additional contact means having respective terminal post portions extending from said connector into apertures in said panel board, said terminal post portions of said additional contact means being electrically connected to said metal layer on said opposite side of said panel board dielectric layer.

4. A panel board system as set forth in claim 2 wherein said terminal post portions of said connector contact means extend from said connector in parallel relation to each other in a plurality of rows with the terminal post portions in adjacent rows being arranged in staggered relation to each other to provide spacings between said terminal post portions relatively greater than said selected center-to-center spacings.

5. A panel board system as set forth in claim 2 wherein said integrated circuit device has a plurality of electrically conductive metal layers formed on said one card side respectively disposed between pairs of said circuit paths on said one card side in spaced, electrically-insulated relation to said circuit paths for electrically isolating said circuit paths from each other.

6. A panel board system comprising: at least one integrated circuit device embodying a pair of rigid dielectric cards, an integrated circuit chip mounted on one side of each of said cards and having a plurality of chip terminals, a plurality of electrically conductive paths on said one side of each of said cards in electrically insulated relation to each other, said circuit paths on said one side of each of said cards being electrically connected with selected terminals of said integrated circuit chip mounted on said one card side and terminating with selected center-to-center spacings between said paths along one edge of said card, means enclosing said chips and said circuit paths on each of said cards while leaving said terminations of said circuit paths exposed along said one edge of said cards, and an electrically conductive metal layer sandwiched between and bonded to the opposite sides of said cards providing said device circuit paths on each of said cards with selected, controlled impedances; at least one connector embodying a pair of dielectric spacer means each having a plurality of electrical contact means arranged on one side of said spacer means in spaced, electrically-insulated relation to each other with said selected center-to-center spacings between said contact means on each of said spacer means to provide corresponding circuit paths within said connector, said connector spacer means having an electrically conductive metal layer sandwiched between and bonded to the opposite sides of said spacer means providing impedances in said connector circuit paths matching said impedances in said device circuit paths, said connector detachably mounting said integrated circuit device thereon and having said contact means engaging respective circuit path terminations of said integrated circuit device, said connector contact means having respective terminal post portions extending from said connector; and a rigid panel board having apertures receiving said terminal post portions of said connector contact means therein, said panel board embodying a layer of dielectric material having electrically conductive circuit paths means on one side of said dielectric layer electrically connected to selected terminal post portions of said connector contact means and having an electrically conductive metal layer on the opposite side of said dielectric layer providing impedances in said panel board circuit paths matching said impedances in said connector circuit paths.

7. A panel board system as set forth in claim 6 wherein means electrically connect said metal layer in said integrated circuit device to at least one of said circuit paths on said device cards.

8. A panel board system as set forth in claim 7 wherein means electrically connect said metal layer in said connector to at least one connector contact means which detachably engages said one circuit path of said integrated circuit device.

9. A panel board system as set forth in claim 8 wherein said one connector contact means has its terminal post portion electrically connected to said metal layer on said opposite side of said panel board.

10. A panel board system as set forth in claim 6 wherein said terminal post portions of said connector contact means extend from said connector in parallel relation to each other in a plurality of rows with the terminal post portions in adjacent rows being arranged in staggered relation to each other to provide spacings between said terminal post portions relatively greater than said selected center-to-center spacings.

11. A connector comprising a pair of dielectric spacers, a plurality of electrical contact means secured on one side of each of said spacers in spaced, electrically-insulated relation to each other with first portions thereof providing connector circuit paths across said spacers, a metal layer secured between the opposite sides of said spacers for providing said connector circuit paths with controlled impedances, said connector contact means having respective leaf portions electrically connected to said first contact portions and extending from said spacers, said connector contact means having respective terminal post portions electrically connected to said first contact portions extending away from said spacers to extend from said connector in parallel relation to each other in a plurality of rows with said terminal post portions in adjacent rows being arranged in staggered relation to each other.

12. An integrated circuit device comprising a pair of rigid dielectric cards, an integrated circuit chip mounted on one side of each of said cards and having a plurality of chip terminals, a plurality of electrically conductive paths on said one side of each of said cards in electrically insulated relation to each other, said circuit paths on said one side of said cards being electrically connected at one end with selected terminals of said integrated circuit chip mounted on said one card side and terminating with selected center-to-center spacings between said paths along one edge of said card, means enclosing said integrated circuit chip and substantial portions of said circuit paths while leaving said terminations of said circuit paths exposed along said one edge of said card, an electrically conductive metal layer secured between the opposite sides of said cards providing said circuit paths on each of said cards with controlled impedances, and means electrically connecting said metal layer in said integrated circuit device to at least one of said circuit paths on said device cards.

13. A connector as set forth in claim 11 having means electrically connecting said metal layer in said connector to at least one of said connector contact means.

* * * * *